United States Patent
Hol et al.

(10) Patent No.: US 6,831,285 B2
(45) Date of Patent: Dec. 14, 2004

(54) LITHOGRAPHIC APPARATUS, MAGNETIC SUPPORT FOR USE THEREIN, DEVICE MANUFACTURING METHOD, AND DEVICE MANUFACTURED THEREBY

(75) Inventors: Sven Antoin Johan Hol, Eindhoven (NL); Edwin Johan Buis, Belfeld (NL); Robrecht Emiel Maria Leonia De Weerdt, Hoogstraten (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/157,029

(22) Filed: May 30, 2002

(65) Prior Publication Data

US 2003/0052284 A1 Mar. 20, 2003

(51) Int. Cl.⁷ .............................................. G01N 21/86
(52) U.S. Cl. ..................... 250/548; 250/559.3; 250/239
(58) Field of Search ............................. 250/548, 559.3, 250/559.29, 559.33, 221, 239; 356/399–401; 355/53–55; 324/207.11–207.16

(56) References Cited

U.S. PATENT DOCUMENTS

| | | | | |
|---|---|---|---|---|
| 4,506,205 A | * | 3/1985 | Trost et al. ................... | 318/653 |
| 4,535,278 A | * | 8/1985 | Asakawa ..................... | 318/687 |
| 5,608,773 A | | 3/1997 | Korenaga et al. .............. | 378/34 |
| 5,780,943 A | * | 7/1998 | Ono .............................. | 310/12 |
| 5,844,666 A | * | 12/1998 | Van Engelen et al. ......... | 355/72 |
| 5,870,943 A | * | 2/1999 | Levi et al. ..................... | 99/287 |
| 5,939,852 A | * | 8/1999 | Akutsu et al. .............. | 318/640 |
| 6,646,721 B2 | | 11/2003 | Compter et al. .............. | 355/72 |
| 2003/0058425 A1 | | 3/2003 | Watson et al. | |

FOREIGN PATENT DOCUMENTS

| | | | |
|---|---|---|---|
| EP | 1 001 512 A | * | 5/2000 |
| EP | 1243969 A | | 9/2002 |
| JP | 09 056135 A | * | 2/1997 |

* cited by examiner

*Primary Examiner*—Que T. Le
(74) *Attorney, Agent, or Firm*—Pillsbury Winthrop LLP

(57) ABSTRACT

A lithographic apparatus includes a support that provides a magnetic force in a first direction between a first part and a second part of the apparatus. The support comprises first, second and third magnet assemblies, the first and third magnet assemblies attached to the first part and each including at least one magnet oriented such that its magnetic polarization is substantially parallel or anti-parallel to the support direction. The first and third magnet assemblies define a space between them in a second direction that is substantially perpendicular to the first direction. The second magnet assembly is attached to the second part and includes at least one magnet. The second magnet assembly is at least partly located in the space. The at least one magnet of the second magnet assembly has its magnetic polarization oriented so as to produce a bias force substantially along the support direction by magnetic interaction between the first, second and third magnet assemblies.

39 Claims, 11 Drawing Sheets

LITHOGRAPHIC APPARATUS, MAGNETIC SUPPORT FOR USE THEREIN, DEVICE MANUFACTURING METHOD, AND DEVICE MANUFACTURED THEREBY

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT patent applications WO 98/38597 and WO 98/33096, incorporated herein by reference. In the case of a programmable mirror array, the support structure may be embodied as a frame or table, for example, which may be fixed or movable as required.

Another example of a pattering device is a programmable LCD array. An example of such a construction is given in U.S. Pat. No. 5,229,872, incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792, incorporated herein by reference.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

Within lithographic apparatus supports are required that provide a permanent force to oppose gravity. For instance quasi-static supports are required to support an isolated reference, or metrology, frame (which supports the projection system and various sensor devices) and isolate it from external vibrations. Dynamic supports are, for instance, required to support a short-stroke module for a substrate or patterning device on a long-stroke module. In such dynamic supports a static force component is provided to support the weight of the short-stroke module and a dynamic force component is provided to drive the short-stroke module. In both static and dynamic supports it is important that the support has very low stiffness to prevent the transmission of vibrations.

Previously, air-mounted bearings have been used to provide the static supports to support and isolate the metrology frame. While these systems do provide supports with very low stiffness, they have the disadvantage that they are relatively complicated, require a supply of compressed air (which in turn requires a compressor which produces vibrations that must be isolated from the lithographic apparatus) and are not suitable for use in a vacuum.

Previous solutions for both dynamic and static supports included the use of a pneumatic support to compensate for gravity. A pneumatic support is, for instance, disclosed in WO 99/05573 and EP 0973067 and may include a piston supported by a pressurized gas in a pressure chamber of a cylinder in which the piston is being journalled by a gas-bearing. The pneumatic support may require a rather large volume of pressurized gas to provide a good isolation from vibrations, and any turbulence and pressure variations in the pressurized gas will be transmitted to the piston and the supported object, which may make their application less effective and inconvenient. Prevention of transmission of vibrations in the support direction is quite successful but prevention of vibrations in a plane perpendicular to the support direction requires further measures such as a further gas-bearing allowing for frictionless movement in the perpendicular direction. Both a gas-bearing and a pneumatic support are not very well compatible with a vacuum environment.

Further, it has been proposed to provide a supporting force by a magnetic attraction and/or repulsion such as, for instance, disclosed in EP 1001512 or U.S. Pat. No. 5,780, 943. However, the proposed solutions provide a supporting force that may be positional dependent both along and perpendicular to the support direction. The proposed solutions may also be subject to demagnetization effects.

SUMMARY OF THE INVENTION

It is an aspect of the present invention to provide supports which are relatively simple, suitable for use in a vacuum, require minimal services (such as compressed air and cooling) and provide substantially constant support within a defined operating volume, both along and perpendicular to the support direction.

It is yet another aspect of the invention to provide magnetic supports which take a small overall volume since space is generally very limited in lithographic apparatus where such magnetic supports may find their application.

Yet another aspect of the invention is to provide magnetic supports of which a nominal supporting force is easily adjustable.

Yet another object of the invention is to provide magnetic supports that may efficiently be combined with a current carrying element for providing an additional force along the support direction.

This and other aspects are achieved according to the invention in a lithographic apparatus including a radiation system constructed and arranged to supply a projection beam of radiation; a support structure for supporting a patterning device, the patterning device constructed and arranged to pattern the projection beam according to a desired pattern; a substrate table to hold a substrate; and a projection system constructed and arranged to project the patterned beam onto a target portion of the substrate; a support that provides a magnetic force in a first direction between a first part and a second part of the apparatus, wherein the support includes first, second and third magnet assemblies and the first and third magnet assemblies are attached to the first part and each includes at least one magnet oriented such that its magnetic polarization is substantially parallel or anti-parallel to the first direction; the first and third magnet assemblies define a space between them in a second direction that is substantially perpendicular to the first direction; the second magnet assembly is attached to the second part and includes at least one magnet, the second magnet assembly at least partly located in the space; and the at least one magnet of the second magnet assembly has its magnetic polarization oriented so as to produce a bias force substantially along the first direction by magnetic interaction between the first, second and third magnet assemblies.

Such a configuration of magnets provides a considerable volume in which the second magnet assembly can move without any substantial variation in the supporting force. This provides for a very low stiffness support both along and perpendicular to the support direction.

In an embodiment of the present invention at least one of the first, second and third magnet assemblies includes at least one permanent magnet. This is advantageous since electromagnets, in comparison, constantly require an electric current to provide the bias force. This in turn produces heat which must be dissipated and may necessitate additional cooling apparatus.

In another embodiment of the invention, the second magnet assembly circumscribes or encloses the first magnet assembly and the third magnet assembly circumscribes or encloses the second magnet assembly in a plane perpendicular to the first direction. Preferably at least one of the first, second and third magnet assemblies is annular in a cross-section perpendicular to the first direction. This is advantageous because variations in the magnet strength will have less effect on the characteristics of the magnetic support.

In a further embodiment of the present invention at least one of the first and third magnet assemblies includes two magnets which can be adjusted so as to vary their relative positions. This is advantageous as it allows the bias force to be altered depending on the load that the support is required to carry.

In a still further embodiment of the present invention a magnet of the third magnet assembly is oriented such that its magnetic polarization is substantially parallel to the magnetic polarization of a magnet of the first magnet assembly and a magnet of the second magnet assembly is oriented such that its magnetic polarization is substantially parallel or anti-parallel to that of a magnet of the first magnet assembly. This embodiment is advantageous as the resulting support may be relatively slender for a given size of bias force provided.

In a still further embodiment of the present invention a magnet of the third magnet assembly is oriented such that its magnetic polarization is substantially anti-parallel to that of a magnet of the first magnet assembly and a magnet of the second magnet assembly is oriented such that its magnetic polarization is substantially perpendicular to that of a magnet of the first magnet assembly. This embodiment is advantageous as it provides a support that has a relatively large travel within a given range of the maximum static force for a given size of the magnetic support.

In a still further embodiment of the invention, the support may further comprise an electrically conductive element, connectable to a power supply arranged so as to produce a force between the first and second parts of the apparatus by interaction between an electrical current carried by the electrically conductive element and a magnetic field of at least one of the first, second and third magnet assemblies. This is advantageous as the resulting force may be used to control the separation of the first and second parts of the lithographic apparatus.

In another aspect the invention provides for a lithographic apparatus including a radiation system constructed and arranged to supply a projection beam of radiation; a support structure constructed and arranged to support patterning device, the patterning device constructed and arranged to pattern the projection beam according to a desired pattern; a substrate table to hold a substrate; and a projection system constructed and arranged to project the patterned beam onto a target portion of the substrate; a support that provides a magnetic force in a first direction between a first part and a second part of the apparatus, wherein the support includes first, second and third magnet assemblies and the first and third magnet assemblies are attached to the first part and each includes at least one magnet oriented such that its magnetic polarization is substantially parallel or anti-parallel to the first direction, at least one of the first and third magnet assemblies having a substantially rotationally symmetric configuration around an axis along the first direction; the first and third magnet assemblies define a space between them; the second magnet assembly is attached to the second part and includes at least one magnet, the second magnet assembly at least partly being located in the space; and the at least one magnet of the second magnet assembly has its magnetic polarization oriented so as to produce a bias force substantially along the first direction by magnetic interaction between the first, second and third magnet assemblies.

In yet another aspect the invention provides for a lithographic apparatus including a radiation system constructed and arranged to supply a projection beam of radiation; a support structure constructed and arranged to support a patterning device, the patterning device constructed and arranged to pattern the projection beam according to a desired pattern; a substrate table to hold a substrate; and a projection system constructed and arranged to project the patterned beam onto a target portion of the substrate; a support that provides a magnetic force in a first direction between a first part and a second part of the apparatus, wherein the support includes first and second magnet assemblies and the second magnet assembly is attached to the second part and comprises at least one magnet having its magnetic polarization oriented so as to produce a bias force substantially along the first direction by magnetic interaction between the first and second magnet assemblies; and the first magnet assembly is attached to the first part and includes at least two permanent magnets, a relative position of the permanent magnets being adjustable so as to adjust the bias force.

In yet another aspect the invention provides for a lithographic apparatus including a radiation system constructed and arranged to supply a projection beam of radiation; a support structure constructed and arranged to support a patterning device, the patterning device constructed and arranged to pattern the projection beam according to a desired pattern; a substrate table to hold a substrate; and a projection system constructed and arranged to project the patterned beam onto a target portion of the substrate; a support that provides a magnetic force in a first direction between a first part and a second part of the apparatus, wherein the support includes first and second magnet assemblies and; the first magnet assembly is attached to the first part and has a magnetic polarization that is oriented substantially parallel or anti-parallel to the first direction; the second magnet assembly is attached to the second part and includes at least one magnet having its magnetic polarization oriented along a second direction perpendicular to the first direction so as to produce a bias force substantially along the first direction by magnetic interaction between the first and second magnet assemblies; and an electrically conductive element connectable to a power supply, the electrically conductive element being attached to the first part so as to produce a force parallel to the first direction between the first and second parts by interaction of an electrical current carried by the electrically conductive element and a magnetic field of the second magnet assembly.

According to yet a further aspect of the invention there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; providing a support that provides a magnetic force in a first direction between a first part and a second part of the apparatus, comprising first, second and third magnet assemblies wherein the first and third magnet assemblies are attached to the first part and each comprises at least one magnet oriented such that its magnetic polarization is substantially parallel or anti-parallel to the first direction; the first and third magnet assemblies are arranged to define a space between them in a second direction that is substantially perpendicular to the first direction; the second magnet assembly is attached to the second part and comprises at least one magnet, the second magnet assembly at least partly located in the space; and the at least one magnet of the second magnet assembly has its magnetic polarization oriented so as to produce a bias force substantially along the support direction by magnetic interaction between the first, second and third magnet assemblies.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and extreme ultra-violet (EUV) radiation, (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2b shows magnetic field lines calculated for the configuration of FIG. 2a;

FIG. 3b shows magnetic field lines calculated for the configuration of FIG. 3a;

FIG. 4b shows magnetic field lines calculated for the configuration of FIG. 4a;

FIG. 5b shows magnetic filed lines calculated for the support shown in FIG. 6a;

FIGS. 6a and 6b show the results of a first simulation of a support according to the arrangement of FIG. 5a;

FIG. 6a shows a contour plot of the supporting force in Newton (N) for vertical (y-axis, ±1 mm) and horizontal (x-axis, ±1.5 mm) movements;

FIG. 6b shows a contour plot of the radial force in Newton (N) for vertical (y-axis, ±1 mm) and horizontal (x-axis, ±1.5 mm) movements;

FIGS. 7a and 7b show the results of a second simulation of a support according to the arrangement of FIG. 5a;

FIG. 7a shows a contour plot of the supporting force in Newton (N) for vertical (y-axis, ±1 mm) and horizontal (x-axis, ±1.5 mm) movements;

FIG. 7b shows a contour plot of the radial force in Newton (N) for vertical (y-axis, ±1 mm) and horizontal (x-axis, ±1.5 mm) movements;

FIG. 8 shows the schematic layout of a variant of the support of FIG. 5a;

FIG. 9b shows the magnetic filed lines calculated for the support shown in FIG. 7a;

In the Figures, corresponding reference symbols indicate corresponding parts.

DETAILED DESCRIPTION

Figure 1:
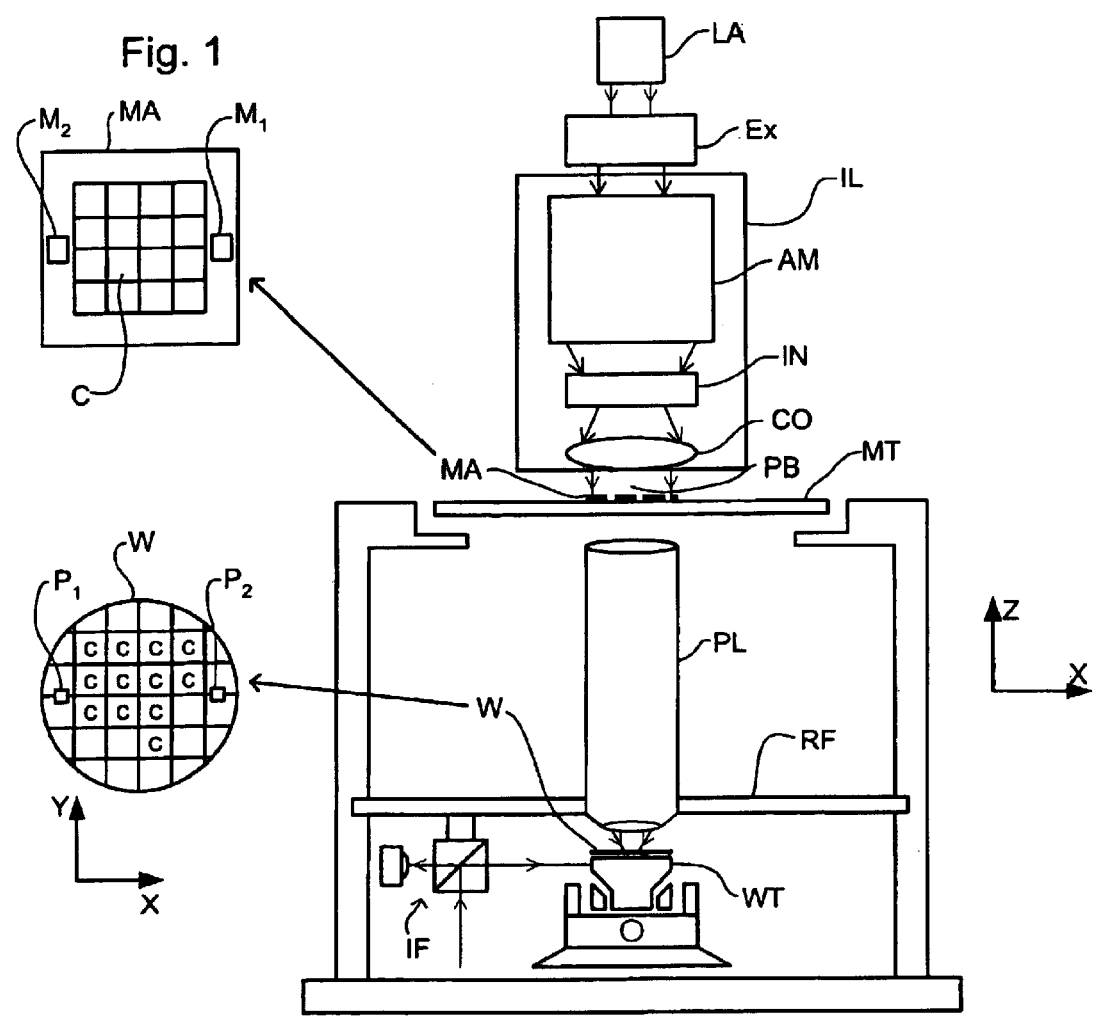
FIG. 1 depicts a lithographic projection apparatus according to an embodiment of the invention.

FIG. 1 schematically depicts a lithographic projection apparatus according to a particular embodiment of the invention. The apparatus includes a radiation system Ex, IL that supplies a projection beam PB of radiation (e.g. UV or EUV radiation). In this embodiment, the radiation system also comprises a radiation source LA; a first object table (mask table) MT provided with a mask holder for holding a mask MA (e.g. a reticle), and connected to a first positioning device $M_1$ $M_2$ to accurately position the mask with respect to a projection system PL; a second object table (substrate table) WT provided with a substrate holder for holding a substrate W (e.g. a resist-coated silicon wafer), and connected to a second position device $P_1$, $P_2$ to accurately position the substrate with respect to the projection system PL; the projection system ("lens") PL (e.g. a refractive or catadioptric system, a mirror group or an array of field deflectors) to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device $P_1$, $P_2$ (and interferometer IF), the substrate table WT can be moved accurately, e.g. so as to position different target portions C in the path of the beam PB. Similarly, the first positioning device $M_1$, $M_2$ can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Some conceptual arrangements of the invention will now be described with reference to the drawings.

Figure 2A:
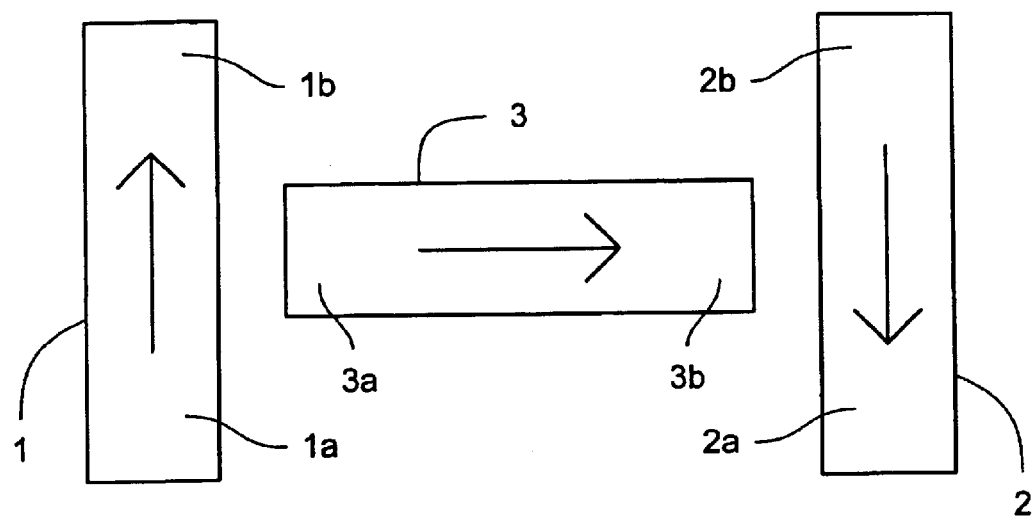
FIG. 2a shows the schematic layout of the magnets for one configuration according to the present invention.
Figure 2B:
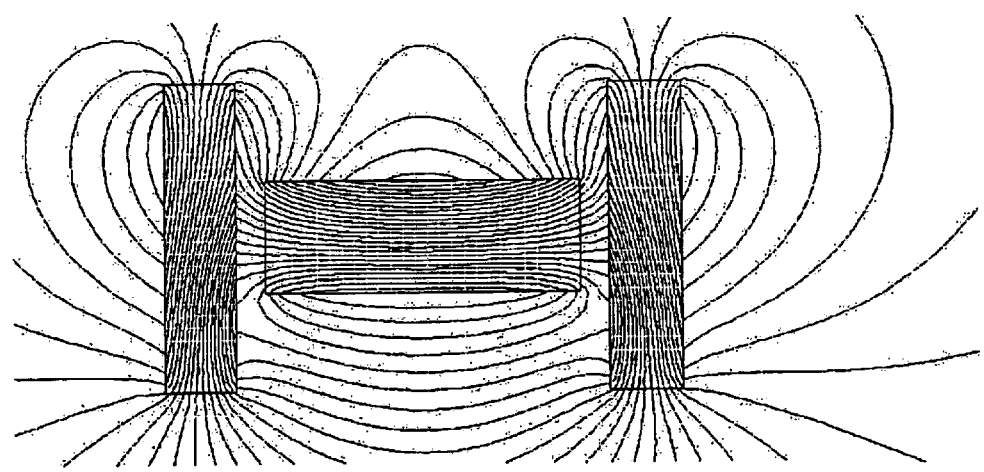

FIGS. 2a and 2b show a configuration of magnets according to the present invention and the corresponding magnetic field lines that this configuration produces. In this configuration a first and a third permanent magnet 1, 2 are arranged on a base part (not shown) of the apparatus from which an element is to be supported. The base may be attached to the floor on which the apparatus is installed, in which case the element to be supported could be the isolated reference frame RF, or the base may be a dynamic component such as a long-stroke module supporting a short-stroke module of one of the object tables. The magnets are arranged such that their magnetic polarization is vertical and opposite to one another. A second magnet 3 is attached to the element to be supported (also not shown). It is arranged such that its magnetic polarization is horizontal and it is located between the first and third magnets 1, 2 attached to the base. However, the configuration might also comprise electromagnets in place of the permanent magnets. In a variation, magnet 3 is attached to the base and magnets 1, 2 are attached to the element to be supported.

The magnetic interaction produces a vertical force on the second magnet 3 relative to the first and third magnets 1, 2 and therefore provides a vertical force to support the element being supported from the base. This force is produced because the left hand pole 3a (as shown) of the second magnet 3 is repelled from the bottom pole 1a of the first magnet 1 and attracted to the top pole 1b while the right hand pole 3b of the second magnet 3 is repelled by the bottom pole 2a of the third magnet 2 and attracted to the top pole 2b.

Within a vertical range, the vertical force on the second magnet 3 only varies slightly, which results in low stiffness, since the magnetic field density variations are small. The second magnet 3 experiences negative stiffness at the upper poles 1b, 2b of the first and third magnets 1, 2 and positive stiffness at the bottom two poles 1a, 2a which substantially cancel to result in very low overall stiffness. Furthermore the variation of the vertical force upon a horizontal movement (within the plane of the drawing) of the second magnet 3 is also found to be very small.

This configuration is advantageous because it produces a high vertical force and has low stiffness in the vertical and horizontal directions. Furthermore, there is minimal risk of the magnets becoming demagnetized and, as a result of the symmetry of the configuration, the moment around an axis perpendicular to the figure is minimal. Compensation for any unbalance in the vertical force between the first and third magnets 1, 2 may be compensated for by applying a horizontal offset to one of the first and third magnets 1, 2.

Figure 3A:
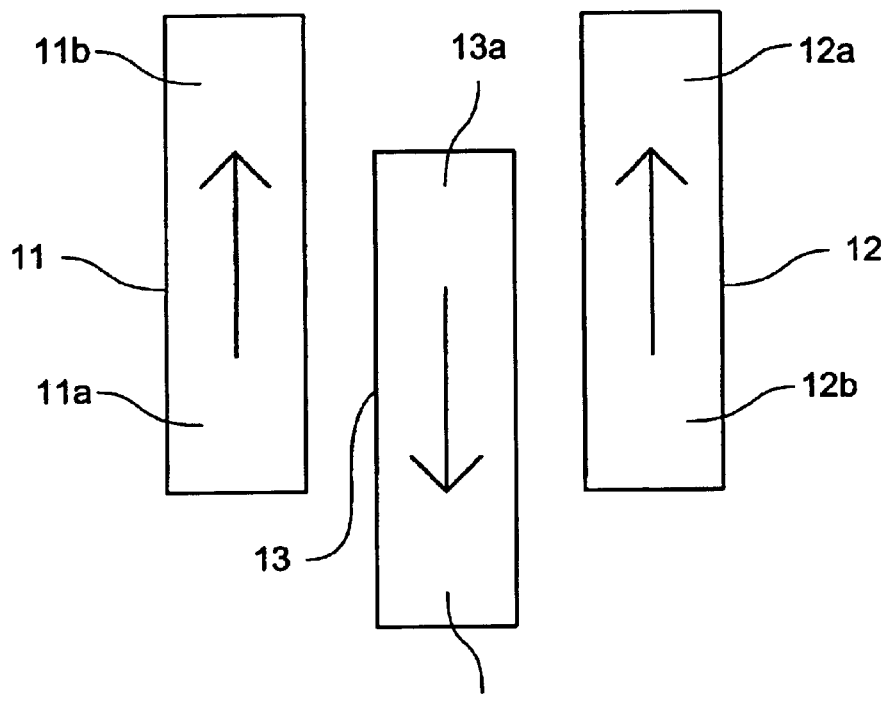
FIG. 3a shows the schematic layout of the magnets for a further configuration according to the present invention.
Figure 3B:
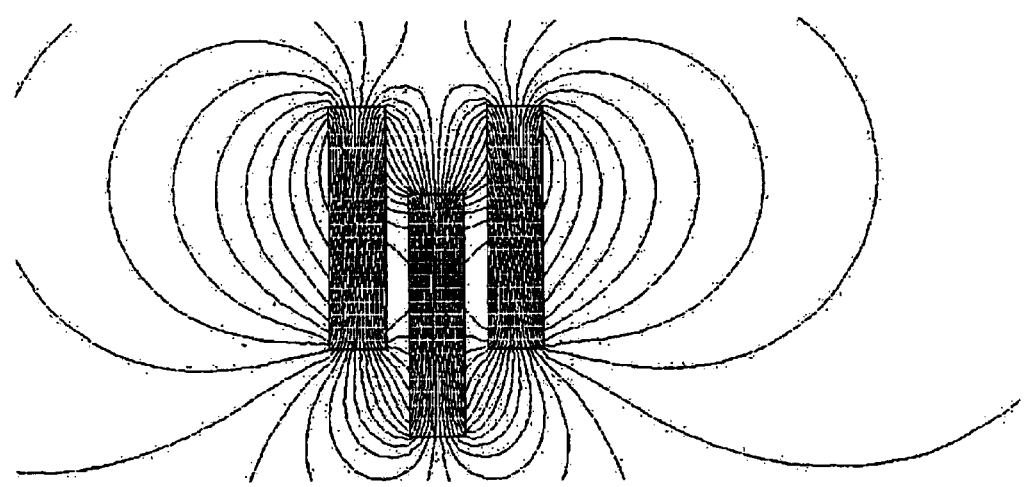
Figure 4A:
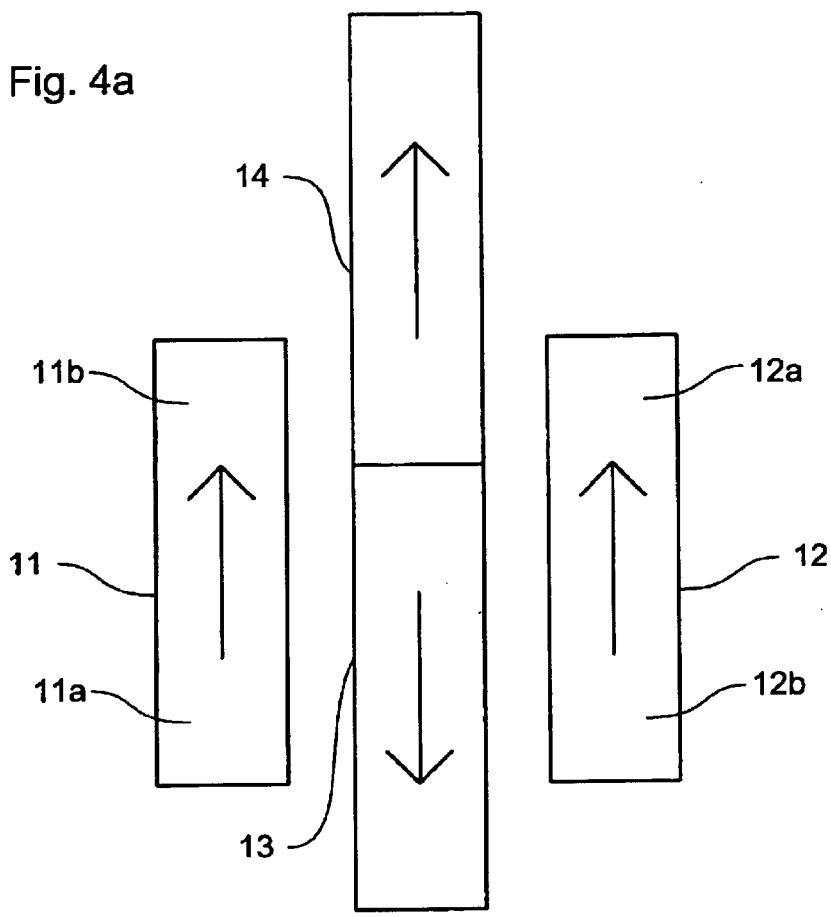
FIG. 4a shows the schematic layout of the magnets for a further configuration according to the present invention.

FIGS. 3a and 3b show a different configuration of magnets according to the present invention and the corresponding magnetic field lines that the configuration produces. The configuration is similar to that shown in FIGS. 2a and 2b but in this configuration the first and third magnets 11, 12 are arranged such that their magnetic polarization is in the same direction (oriented upwards or downwards) and the second magnet 13 is arranged such that its magnetic polarization is vertical and opposite (anti-parallel) or parallel to that of the first and third magnets 11, 12. In the case the magnetic polarization is oriented anti-parallel, it will partly project downward from the space between magnets 11, 12 having an upward oriented magnetic polarization as shown in FIGS. 3a and 4a. In case the second magnet 13 has a parallel magnetic orientation, it will project upwards as is shown for magnet 14 in FIG. 4a. As before, the first and third magnets 11, 12 are attached to the base and the second magnet 13 is attached to the element being supported (or vice versa).

This configuration produces similar stiffnesses and forces to the first configuration, described above, but the width is smaller.

As before, the magnets may be electromagnets, but are preferably permanent magnets. Permanent magnets require no electrical currents and therefore do not result in power dissipation, corresponding heat loads and temperature variations of the various elements, for which cooling may be inconvenient, especially in a vacuum environment.

Figure 4B:
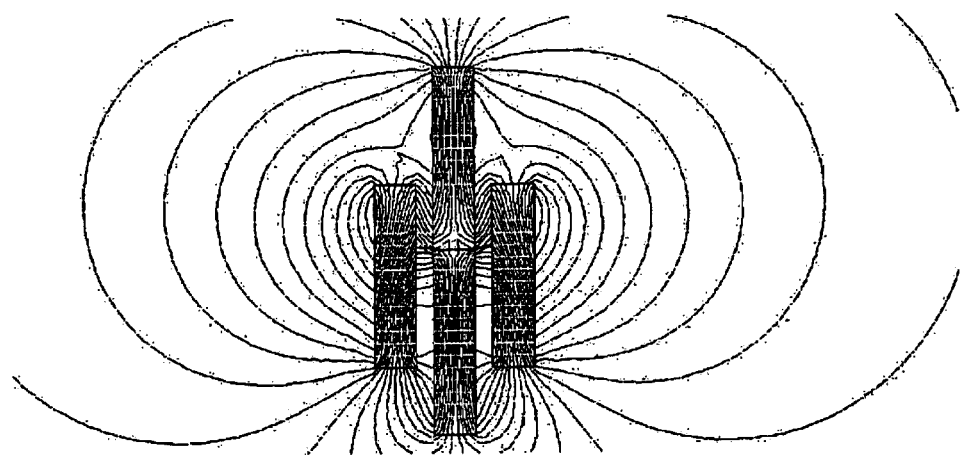

FIGS. 4a and 4b show a further configuration of magnets according to the present invention (which is a variation of that shown in FIGS. 3a and 3b) and the corresponding magnetic field lines that the configuration produces. The difference between the configuration shown in FIGS. 3a and 3b and the configuration shown in FIGS. 4a and 4b is the presence of a fourth magnet 14 connected to the second magnet 13. The fourth magnet 14 is arranged such that its magnetic polarization is opposite to that of the second magnet 13. This configuration provides a larger vertical supporting force than the configuration shown in FIGS. 3a and 3b.

All of the above described conceptual arrangements can also be used in corresponding arrangements with rotational symmetry (i.e. annular and/or cylindrical arrangements in which once half of the cross section would be essentially the same as that described above). Rotational symmetric arrangements are advantageous because variations in the magnet strength have less effect on the characteristics of the support.

The conceptual embodiments shown in FIGS. 2a, 3a and 4a (and also in FIG. 9a) may prove to be advantageous with respect to a low overall stiffness in a large working volume provided by those configurations having one or more magnets of one magnet assembly at least partly located in a space defined between magnets of another magnet assembly. However, the magnet may also function satisfactory when having one of the magnets 1, 2; 11, 12; 201, 202 of the latter assembly left away. It may result in some larger stiffness in the same working volume, but having the advantage of a less complex and smaller magnetic support unit. Especially the configurations of FIGS. 3a and 4a having one of the magnets 11 or 12 left out would result in a magnetic support having a very small width. For configurations having rotational symmetry this would mean leaving out one of the inner our outer magnets.

In order to produce efficient support devices it is currently intended to use magnetic materials with high energy densities, such as Neodymium Iron Boron (NdFeB) or Samarium Cobalt. However, other permanent magnets may also be used.

Figure 5A:
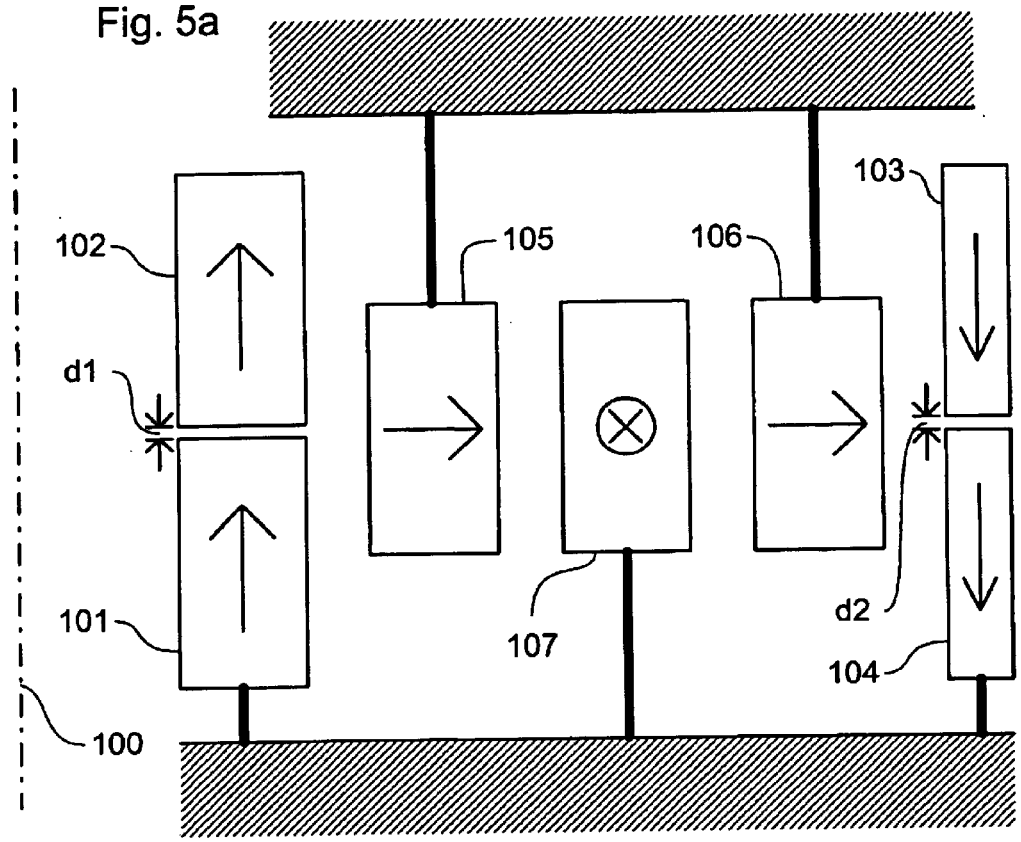
FIG. 5a shows the schematic layout of one half of an axially symmetric support according to the present invention.
Figure 5B:
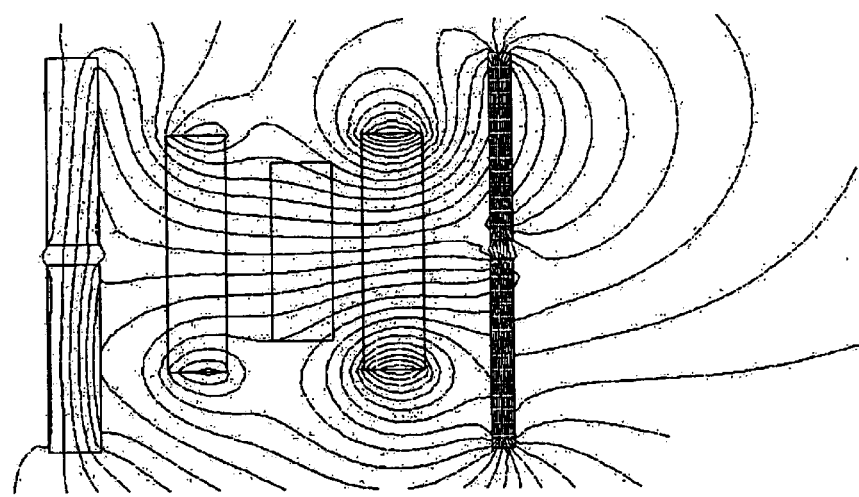

FIG. 5a schematically shows an arrangement that may be used to as a dynamic support for the short-stroke module of a substrate table or the support for a patterning device. FIG. 5b shows the resultant field lines for the arrangement of FIG. 5a.

The arrangement schematically shown in FIG. 5a is a variant of that shown in FIG. 2a. The first and third magnets are split into two parts 101,102 and 103, 104, respectively. The second magnet is also split into two parts 105, 106 and a coil 107 is added between the two parts of the second magnet. Furthermore this arrangement has rotational (axial) symmetry around an axis 100, such that each of the magnets and the coil has an annular shape in a cross-section perpendicular to axis 100. The first and third magnet assemblies 101, 102 and 103, 104, respectively and the coil 107 are mounted on the base (schematically shown), which in this arrangement is the long-stroke module, and the second magnet assembly 105, 106 are mounted on the short-stroke module being supported.

Adjustment of the distance d1 between the two parts of the first magnet 101, 102 and the distance d2 between the two parts of the third magnet assembly 103, 104 adjusts the static force component between the short-stroke and long-stroke modules. This allows the static force component to be tuned to the weight of the short-stroke module. The coil 107 provides a dynamic force component. A controlled current (perpendicular to the plane of the drawing) through the coil interacts with the magnetic field of the second magnets to produce a Lorentz force that adds to, or subtracts from, the static force component between the short-stroke and long-stroke modules thereby producing a net force on the short-stroke module relative to the long-stroke module.

Figure 6A:
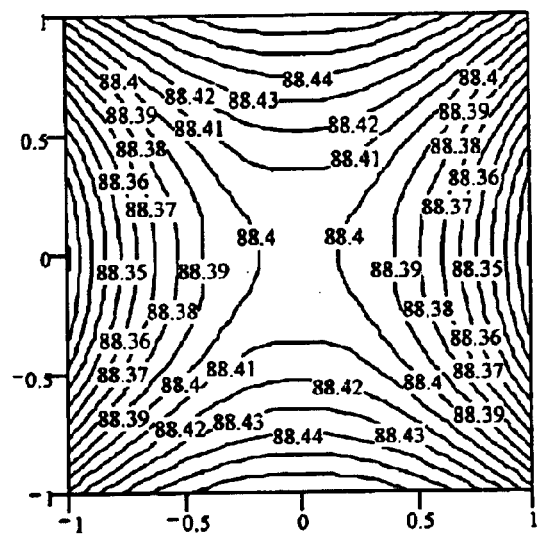
Figure 6B:
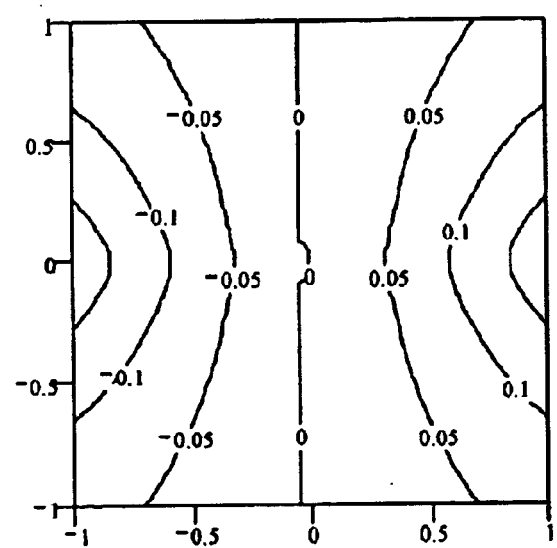

FIGS. 6a, 6b show the vertical and horizontal static forces, respectively, in Newton (N) for horizontal (radial) and vertical (axial) movements of the second magnet assembly 105, 106 to the first and third magnet assemblies 101, 102 and 103, 104, respectively, and coil 107 as derived by simulations of an arrangement as shown in FIG. 5a. Forces and torques are derived by integration of the Maxwell stress tensor along the magnetic field lines. Table 1 shows the dimensions of the elements in the simulation, $\emptyset_{inner}$ and $\emptyset_{outer}$ referring to the inner and outer diameter, respectively, of an element in millimeters (mm). The material of the permanent magnets is NdFeB having a magnetic remanence $B_r$=1.38 Tesla (T) and a magnetic permeability $\mu_r$=1.05. The coil is copper wire (fill factor 0.8). As shown, the vertical force remains largely constant and the horizontal force is much smaller than the vertical force. The distances d1, d2 between the two parts of the first and third magnet assemblies 101, 102, and 103, 104, respectively, were 0.2 mm. Distances d1, d2 may also be varied independently. Tables 2, 3, and 4 summarize the results of the simulation for three different distances d1, d2 between the two parts of the first and third magnet assemblies 101, 102 and 103, 104, respectively. Stiffness is shown in Newton per meter (N/m) and torque in milliNewton meter (mNm). The k-factor refers to a value of the Lorentz force per unit of electrical current through coil 107. Values presented are for a cubic working volume of x=±1.5 mm, y=±1.5 mm and z=±1 mm.

Figure 7A:
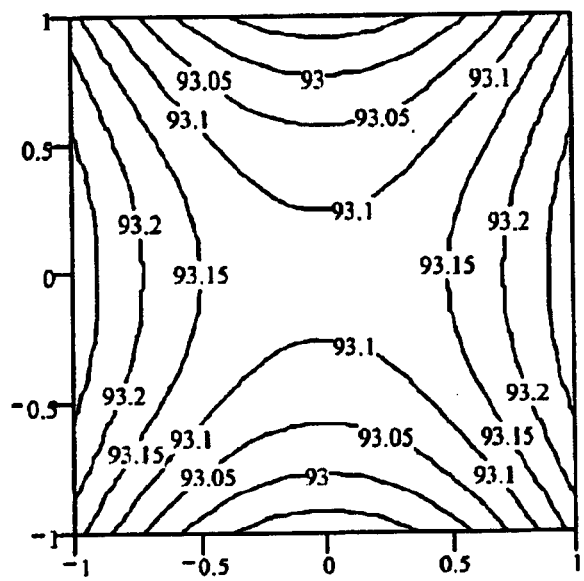
Figure 7B:
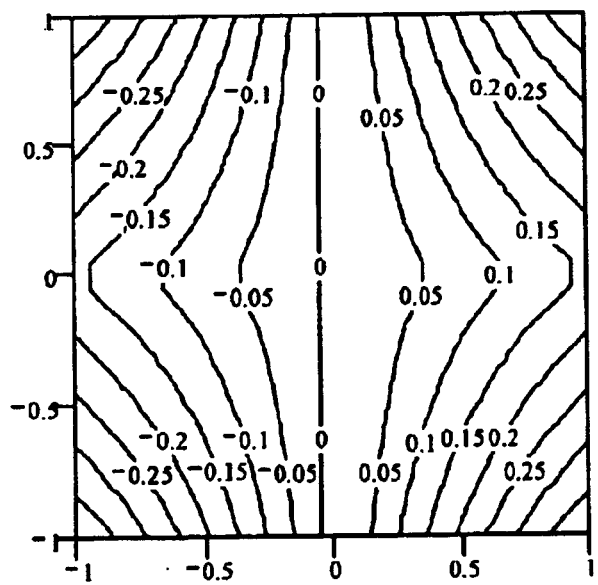

FIGS. 7a and 7b show results which correspond to those shown in FIGS. 6a and 6b, respectively, for a second simulation in which the dimensions of the elements are those shown in Table 5. (It is noted that the values on the horizontal axis of FIGS. 6a, 6b, 7a and 7b should be multiplied by 1.5). Other aspects of the simulation were the same. Tables 6, 7, and 8, below, summarize the results of the second simulation for three different distances d1, d2 between the two parts of the first and third magnets 101 and 102, 103, 104, respectively.

One difference between the configurations of Tables 1 and 2 is the height of the second magnet parts 105, 106 on the one hand and the height of the coil 107 on the other hand. One is chosen larger than the other by an amount of at least the working range in the support direction to have a small variation of the k-factor.

A further observation with regard to the configuration of FIG. 5a is that the integrated magnetic flux over surface area of the first magnet assembly 101, 102 is substantially equal to the integrated magnetic flux over surface area of the second magnet assembly 103, 104 to have a small variation in, or a small value of, the parameters shown in Tables 2, 3, 4, 6, 7 and 8. The configurations are not optimized and are presented, together with their simulation results, for illustrative purposes only.

A table of supporting forces as a function of the position of the second magnet assembly 105, 106 with respect to the first and third magnet assemblies 101, 102 and 103, 104, as shown in FIGS. 6a and 7a, can be stored in a memory device and used to control an additional supporting force by controlling an electrical current in coil 107. In this manner the supporting force can be made more constant over the working volume to yield an even lower value of the effective vertical stiffness of such a device. A similar approach can be chosen to store the values of FIG. 6b or 7b in a memory device to control further actuators (not shown) acting in a plane perpendicular to the support direction, i.e. the radial direction, to further decrease the effective horizontal stiffness.

Figure 8:
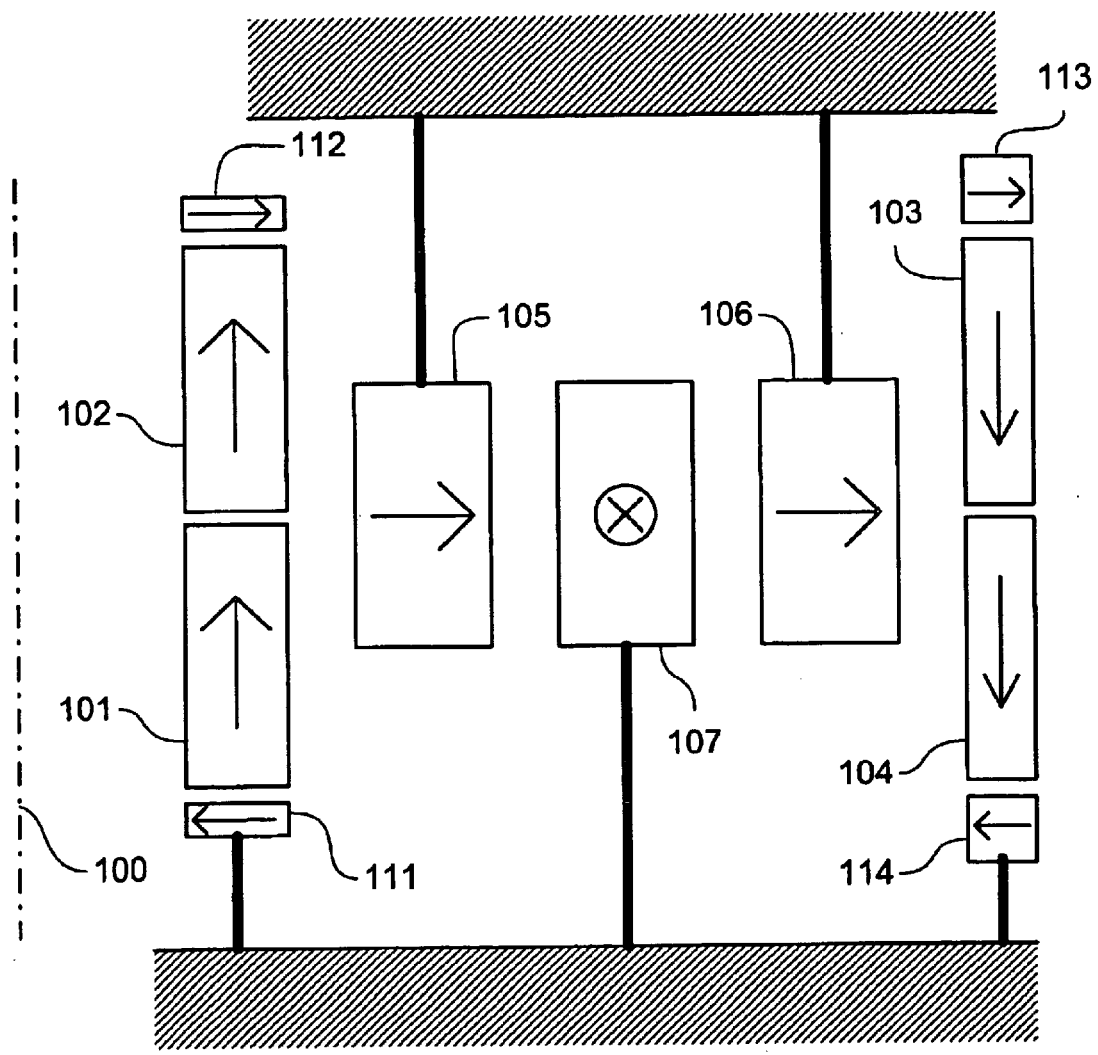

FIG. 8 shows a variant of the arrangement of FIG. 5a. In this arrangement the first and third magnet assemblies 101, 102, 111, 112 and 103, 104, 113, 114, respectively are arranged in a so-called Halbach configuration. This is achieved by the addition of permanent magnets 111, 112, 113, 114 above and below the first and third magnet assemblies 101, 102 and 103, 104, respectively, arranged with their magnetic polarization at an angle of 90° to that of the adjacent magnet part of the first and third magnet assemblies. The Halbach configuration may be used to reduce the stray magnetic fields around the support and may also reduce the mass of the magnets used for a given static force.

Again, as described earlier, one of the first an third magnet assemblies of the embodiments of FIGS. 5a and 8 might be dispensed with at the expense possibly of some additional stiffness. However, such additional stiffness may be balanced by storing a table of supporting forces over the working volume and controlling an additional force by controlling electrical current in coil 107.

Figure 9A:
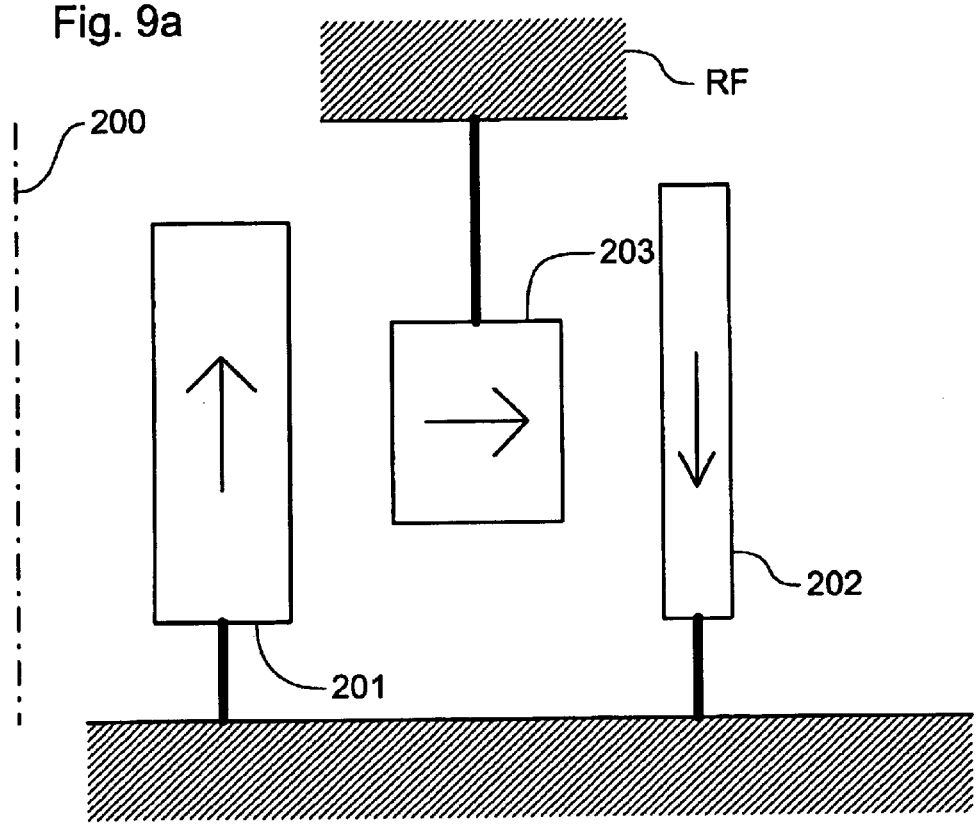
FIG. 9a shows the schematic layout of one half of a further axially symmetric support according to the present invention.
Figure 9B:
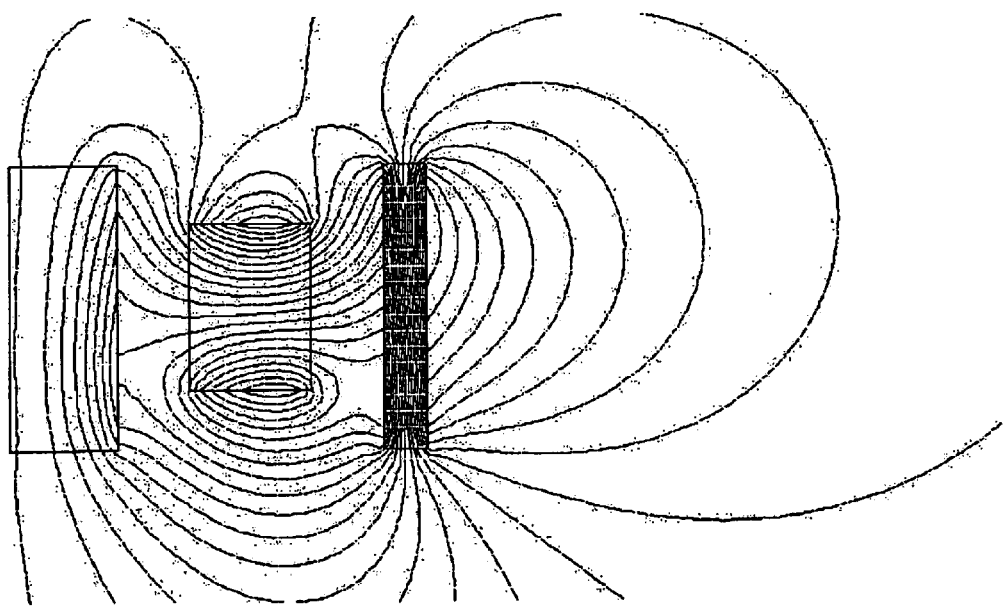

FIG. 9a schematically shows an arrangement that is a further variant of that shown in FIG. 2a and FIG. 9b shows the resulting field lines. In this embodiment the support is intended to be a static support. The support has rotational (axial) symmetry around axis 200 and therefore the first, second and third magnets 201, 203, 202 are annular in shape. The first and third magnets are mounted on the base (schematically shown), which in this case is the floor on which the apparatus is installed, and the second magnet is mounted on the reference frame RF (schematically shown) which is being supported by the magnetic support. In use it is very important that the support has very low stiffness, as is also important for the previous arrangements, in order to isolate the reference frame (and hence key components of the apparatus) from any external vibrations. In a simplified model of a support, it can be thought of as a mass suspended by a weak spring. The natural frequency of such a system is:

$$f_n = \frac{1}{2\pi}\sqrt{\frac{k}{m}} \text{ [Hz]}$$

in which k is the stiffness of the support and m the supported mass. The mass to be supported (per support) is typically in the order of m=1000 kg, and the maximum natural frequency is set to 0.5 Hertz (Hz). From this, the maximum allowable stiffness may be approximated to be 9900 N/m. If this is achieved then any disturbances with frequencies higher than 0.5 Hz will be attenuated, with the attenuation factor increasing with the frequency.

Table 9 shows dimensions of an arrangement used in simulations carried out for the configuration of FIG. 9a. The dimensions given are not for an optimized arrangement of the support but are purely for illustrative purposes. The magnets are formed from NdFeB and have $\mu_r$=1.05 and $B_r$=1.38 T. The simulations show a vertical force of 8311 N±0.01% and a maximal value of absolute vertical stiffness of 2750 N/m for movements in the vertical support direction from 0 to 1 mm.

The support of the reference frame RF may also be provided in an arrangement of FIG. 5a to have a coil to produce a positioning force in the support direction on the frame and/or to further decrease the stiffness.

In the arrangements described above the first and second magnets and the coil, where applicable, are mounted on the base and the third magnet(s) are mounted on the element being supported. In other arrangements according to the present invention, however, this may be reversed. Furthermore, the static and dynamic supports according to the present invention, and described above, may be used to support elements of the lithographic apparatus other than those specifically described above.

Figure 10:
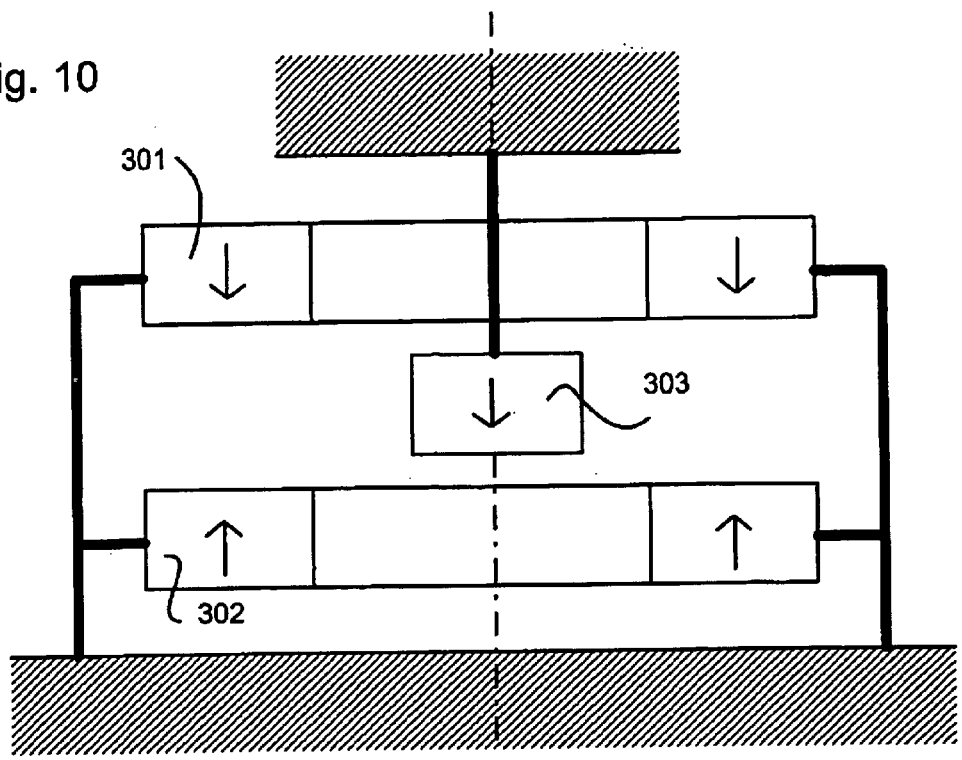
FIGS. 10, 11 and 12 show further schematic lay-outs of embodiments of a magnetic support according to the invention.

FIG. 10 show another embodiment of the magnetic support, which comprises an upper magnet 301 having a magnetic polarization oriented downward and a lower magnet 302 having a magnetic polarization oriented upwards. Both magnets are permanent magnets and have an annular configuration around a common vertical axis. Permanent magnet 303 is located in a space in between magnets 301 and 302 and is also rotationally symmetric around the common vertical axis 34. Magnets 301 and 302 are attached to a base part and magnet 303 to a supported part, or vice versa.

Figure 11:
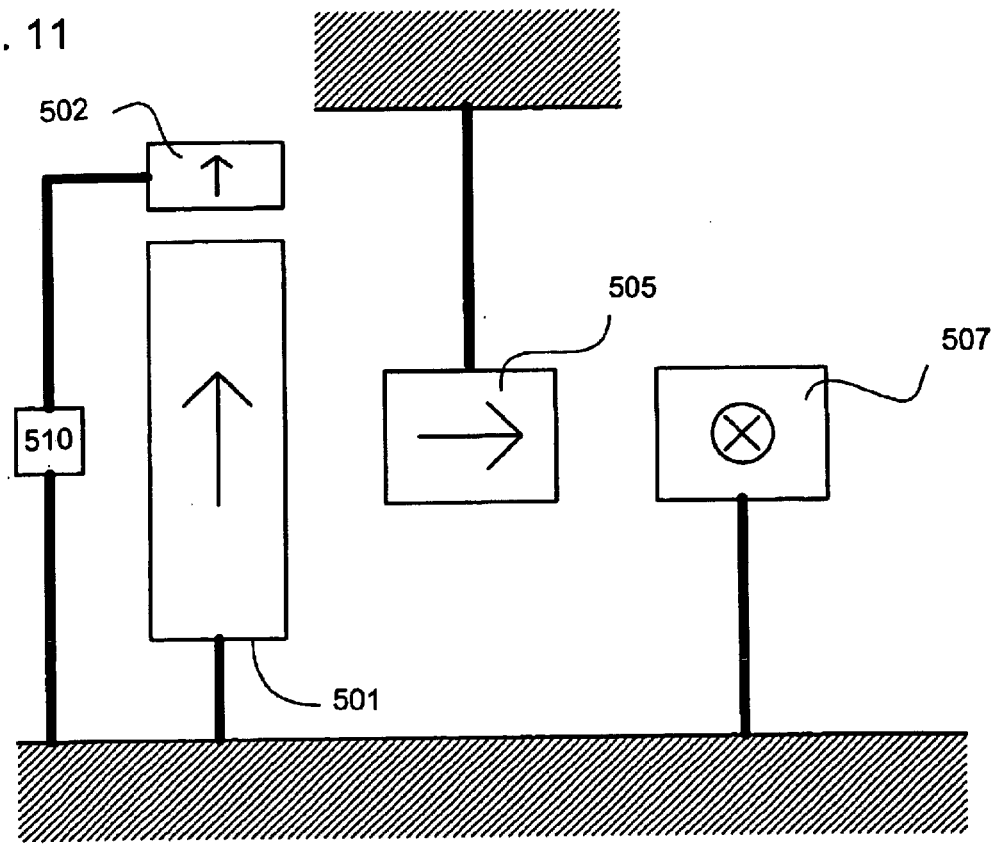

FIG. 11 shows yet another embodiment of the magnetic support that is also a variation to embodiments already described. The FIG. 11 embodiment has rotational symmetry around a vertical axis and comprises inner permanent magnets 501 and 502 of a first magnet assembly having a magnetic polarization along the symmetry axis parallel (or anti-parallel) to the support direction. Another permanent magnet 505 of a second magnet assembly having an annular configuration is arranged around the first magnet assembly 501, 502. Magnet 505 has a radial magnetization in a direction perpendicular to the support direction. The large axially magnetized inner magnet 501 together with the radially magnetized magnet 505 basically provide the magnetic supporting force. Thin axial magnetized magnet 502 is to be regarded as a tuning magnet. By altering the gap between magnets 501 and 502 by adjustment device 510 the nominal supporting force can be adjusted.

FIG. 11 further shows a coil 507 provided around magnet 505 and attached to the base part. An electrical current carried by the electrical windings of the coil will interact with the radial magnetic field component of magnet 505 so as to provide a additional force in the vertical direction. Dependent on the direction of the electrical current, the force will be directed up or down.

Figure 12:
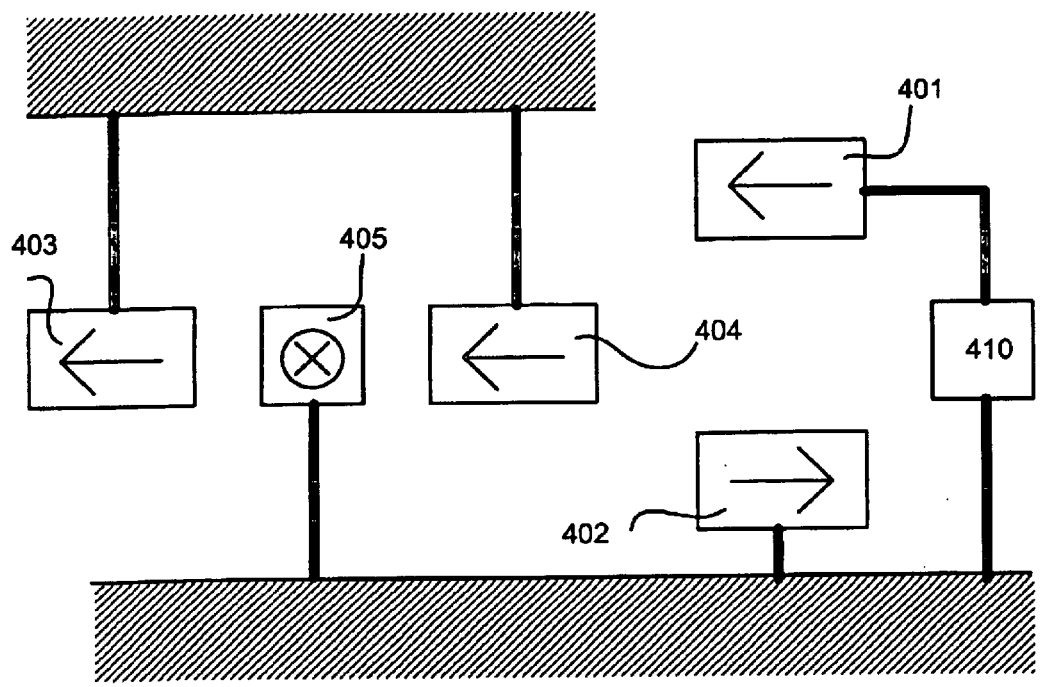

FIG. 12 shows yet another variant of a magnetic support including a current carrying element for an additional vertical force and having magnets of which a relative position is adjustable for adjusting a nominal supporting force. The figure shows a first magnet assembly having annular permanent magnets 401 and 402 with magnetic polarizations directed as shown in the figure, and further shows a second magnet assembly having annular permanent magnets 403 and 404 with magnetic polarizations as shown. The configurations yields a magnetic supporting force that may be adjusted by adjusting the vertical gap between magnets 401 and 402 by adjustment device 410. A coil 405 provides for an additional vertical force that may be directed up or down dependent on an electrical current carried by the windings of the coil.

While specific embodiments of the invention have been described above, it will be appreciated that the invention may be practiced otherwise than as described. The description is not intended to limit the invention. Specifically, no conclusions should be drawn from the relative sizes or the shapes of the elements shown in the figures or described in the illustrative examples above. The size and shape of each element may be varied in order to optimize the performance of the arrangement.

TABLE 1

Dimensions of elements in a first simulation

| Element | $\varnothing_{inner}$ (mm) | $\varnothing_{outer}$ (mm) | Height (mm) |
|---|---|---|---|
| 101 | 11 | 20 | 12.4 |
| 102 | 11 | 20 | 12.4 |
| 103 | 88 | 91 | 12.4 |
| 104 | 88 | 91 | 12.4 |
| 105 | 32 | 44 | 10 |
| 106 | 64 | 75 | 10 |
| 107 | 50 | 60 | 14 |

TABLE 2

Properties when magnet gap d1 = d2 = 0.2 mm in a first simulation

| Property | Value | Unit |
|---|---|---|
| Nominal vertical force | 88.40 | N |
| Maximal vertical stiffness | −170 | N/m |
| Maximal horizontal stiffness | −128 | N/m |
| Maximal variation of vertical force | 0.1 | % |
| Maximal absolute value of horizontal force | 0.18 | N |
| Maximal absolute value of torque | 13.5 | mNm |
| Nominal k-factor | 0.0310 | N/A |
| Maximal variation of k-factor | 0.97 | % |

TABLE 3

Properties when magnet gap d1 = d2 = 0.4 mm in a first simulation

| Property | Value | Unit |
|---|---|---|
| Nominal vertical force | 85.10 | N |
| Maximal vertical stiffness | −270 | N/m |
| Maximal horizontal stiffness | −129 | N/m |
| Maximal variation of vertical force | 0.2 | % |
| Maximal absolute value of horizontal force | 0.18 | N |
| Maximal absolute value of torque | 9.1 | mNm |
| Nominal k-factor | 0.0310 | N/A |
| Maximal variation of k-factor | 0.97 | % |

TABLE 4

Properties for GC when magnet gap d1 = d2 = 0.6 mm in a first simulation

| Property | Value | Unit |
|---|---|---|
| Nominal vertical force | 81.82 | N |
| Maximal vertical stiffness | −430 | N/m |
| Maximal horizontal stiffness | −126 | N/m |
| Maximal variation of vertical force | 0.3 | % |
| Maximal absolute value of horizontal force | 0.19 | N |
| Maximal absolute value of torque | 4.7 | mNm |
| Nominal k-factor | 0.0310 | N/A |
| Maximal variation of k-factor | 0.97 | % |

TABLE 5

Dimensions of elements in a second simulation

| Element | $\varnothing_{inner}$ (mm) | $\varnothing_{outer}$ (mm) | Height (mm) |
|---|---|---|---|
| 101 | 10 | 20 | 12.65 |
| 102 | 10 | 20 | 12.65 |
| 103 | 72 | 74 | 12.65 |
| 104 | 72 | 74 | 12.65 |
| 105 | 31 | 37 | 16 |
| 106 | 55 | 61 | 16 |
| 107 | 43 | 51 | 12 |

TABLE 6

Properties when magnet gap d1 = d2 = 0.2 mm in a second simulation

| Property | Value | Unit |
|---|---|---|
| Nominal vertical force | 93.11 | N |
| Maximal vertical stiffness | 200 | N/m |
| Maximal horizontal stiffness | 212 | N/m |
| Maximal variation of vertical force | 0.2 | % |
| Maximal absolute value of horizontal force | 0.40 | N |
| Maximal absolute value of torque | 8.8 | mNm |
| Nominal k-factor | 0.0241 | N/A |
| Maximal variation of k-factor | 1.50 | % |

TABLE 7

Properties when magnet gap d1 = d2 = 0.4 mm in a second simulation

| Property | Value | Unit |
|---|---|---|
| Nominal vertical force | 90.60 | N |
| Maximal vertical stiffness | 310 | N/m |
| Maximal horizontal stiffness | 178 | N/m |
| Maximal variation of vertical force | 0.15 | % |
| Maximal absolute value of horizontal force | 0.35 | N |
| Maximal absolute value of torque | 9.9 | mNm |
| Nominal k-factor | 0.0241 | N/A |
| Maximal variation of k-factor | 1.50 | % |

TABLE 8

Properties when magnet gap d1 = d2 = 0.6 mm in a second simulation

| Property | Value | Unit |
|---|---|---|
| Nominal vertical force | 88.08 | N |
| Maximal vertical stiffness | 240 | N/m |
| Maximal horizontal stiffness | 149 | N/m |
| Maximal variation of vertical force | 0.12 | % |
| Maximal absolute value of horizontal force | 0.30 | N |
| Maximal absolute value of torque | 11.0 | mNm |
| Nominal k-factor | 0.0241 | N/A |
| Maximal variation of k-factor | 1.50 | % |

TABLE 9

Dimensions of elements in a third simulation

| Element | $\varnothing_{inner}$ (mm) | $\varnothing_{outer}$ (mm) | Height (mm) |
|---|---|---|---|
| 201 | 10 | 120 | 140 |
| 202 | 380 | 420 | 140 |
| 203 | 192 | 312 | 84 |

We claim:

1. A lithographic projection apparatus, comprising:
a radiation system constructed and arranged to provide a beam of radiation;
a support structure constructed and arranged to support a patterning device, the patterning device constructed and arranged to pattern the beam according to a desired pattern;
a substrate table to hold a substrate;
a projection system constructed and arranged to project the patterned beam onto a target portion of the substrate; and
a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame, wherein the support comprises first, second and third magnet assemblies that are configured to magnetically cooperate with one another to provide support and the first and third magnet assemblies are attached to the first part and each comprises at least one magnet oriented such that its magnetic polarization is substantially parallel or anti-parallel to the first direction, the second magnet assembly is attached to the second part and comprises at least one magnet, and wherein the first and third magnet assemblies are substantially spaced apart in a second direction that is substantially perpendicular to the first direction such that the first and third maanet assemblies define a space between them in which the second magnet assembly is at least partly located, and the at least one magnet of the second magnet assembly has its magnetic polarization oriented so as to produce a bias force substantially along the first direction by magnetic interaction between the first, second and third magnet assemblies.

2. A lithographic projection apparatus according to claim 1, wherein at least one of the first, second and third magnet assemblies comprises at least one permanent magnet.

3. A lithographic projection apparatus according to claim 1, wherein the second magnet assembly at least substantially circumscribes the first magnet assembly and the third magnet assembly substantially circumscribes the second magnet assembly in a plane perpendicular to the first direction.

4. A lithographic projection apparatus according to claim 3, wherein the first, second, and third magnet assemblies are at least substantially rotationally symmetric around a common axis substantially parallel to the first direction.

5. A lithographic projection apparatus according to claim 1, wherein at least one of the first and third magnet assemblies comprises two magnets and an adjusting device that adjusts the relative position of the two magnets so as to adjust the bias force.

6. A lithographic projection apparatus according to claim 5, wherein the two magnets are spaced apart in a direction substantially parallel to the first direction to define an adjustable gap therebetween.

7. A lithographic projection apparatus according to claim 1, wherein a magnet of the third magnet assembly is oriented such that its magnetic polarization is substantially parallel to that of a magnet of the first magnet assembly, and a first magnet of the second magnet assembly is oriented such that its magnetic polarization is substantially parallel or anti-parallel to that of a magnet of the first magnet assembly so as to provide the bias force.

8. A lithographic projection apparatus according to claim 7, wherein the second magnet assembly further comprises a second magnet oriented such that its magnetic polarization is substantially anti-parallel to that of the first magnet of the second magnet assembly so as to provide a further bias force in the first direction.

9. A lithographic projection apparatus according to claim 1, wherein a magnet of the third magnet assembly is oriented such that its magnetic polarization is substantially anti-parallel to that of a magnet of the first magnet assembly, and a first magnet of the second magnet assembly is oriented such that its magnetic polarization is substantially perpendicular to that of a magnet of the first magnet assembly so as to provide the bias force.

10. A lithographic projection apparatus, comprising:
   a radiation system constructed and arranged to provide a beam of radiation;
   a support structure constructed and arranged to support a patterning device, the patterning device constructed and arranged to pattern the beam according to a desired pattern;
   a substrate table to hold a substrate;
   a projection system constructed and arranged to project the patterned beam onto a target portion of the substrate; and
   a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame and wherein the support comprises first, second and third magnet assemblies that are configured to magnetically cooperate with one another to provide support and the first and third magnet assemblies are attached to the first part and each comprises at least one magnet oriented such that its magnetic polarization is substantially parallel or anti-parallel to the first direction, at least one of the first and third magnet assemblies having a substantially rotationally symmetric configuration around an axis along the first direction, the second magnet assembly is attached to the second part and comprises at least one magnet, and wherein the first and third maanet assemblies are substantially spaced apart such that the first and third magnet assemblies define a first space between them in which the second magnet assembly is at least partly located; and the at least one magnet of the second magnet assembly has its magnetic polarization oriented so as to produce a bias force substantially along the first direction by magnetic interaction between the first, second and third magnet assemblies.

11. A lithographic projection apparatus according to claim 10, wherein at least one of the first, second and third magnet assemblies comprises at least one permanent magnet.

12. A lithographic projection apparatus according to claim 10, wherein the first and third magnet assemblies are substantially spaced apart in a second direction that is substantially perpendicular to the first direction such that the first and third magnet assemblies define a space between them.

13. A lithographic projection apparatus according to claim 10, wherein the first and third magnet assemblies define a second space between them in the first direction and magnetic polarizations of the first and third magnet assemblies are substantially oppositely directed.

14. A lithographic projection apparatus according to claim 13, wherein both the first and third magnet assemblies have a substantially rotationally symmetric configuration around the axis along the first direction.

15. A lithographic projection apparatus according to claim 14, wherein both the first and second magnet assemblies have a substantially annular configuration.

16. A lithographic projection apparatus, comprising:
   a radiation system constructed and arranged to provide a beam of radiation;
   a support structure constructed and arranged to support a patterning device, the patterning device constructed and arranged to pattern the beam according to a desired pattern;
   a substrate table to hold a substrate;
   a projection system constructed and arranged to project the patterned beam onto a target portion of the substrate; and
   a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame and wherein the support comprises first and second magnet assemblies that are configured to magnetically cooperate with one another to provide support and the second magnet assembly is attached to the second part and comprises at least one magnet having its magnetic polarization oriented substantially perpendicularly to that of a magnet of the first assembly so as to produce a bias force substantially along the first direction by magnetic interaction between the first and second magnet assemblies, the first magnet assembly is attached to the first part and comprises at least two permanent magnets, a relative position of the permanent magnets being adjustable so as to adjust the bias force.

17. A lithographic projection apparatus according to claim 16, wherein the magnetic support comprises a third magnet assembly that magnetically cooperates with the first and second maanet assemblies to provide support, the third magnet assembly being attached to the first part and comprising at least one magnet oriented such that its magnetic polarization is substantially parallel or anti-parallel to the first direction, and the first and third magnet assemblies are substantially spaced apart such that the first and third magnet assemblies define a space between them, in which space the second magnet assembly is at least partly located.

18. A lithographic projection apparatus according to claim 17, wherein the third magnet assembly comprises at least two permanent magnets, a relative position of the at least two permanent magnets of the third magnet assembly being adjustable so as to adjust the bias force.

19. A lithographic projection apparatus according to claim 17, wherein at least one of the first, second and third magnet assemblies has a substantially rotationally symmetric configuration around an axis along the first direction.

20. A lithographic projection apparatus according to claim 10 or 17, wherein the support further comprises an electrically conductive element connectable to a power supply, the electrically conductive element being arranged so as to produce a force between the first and second parts by interaction of an electrical current carried by the electrically conductive element and a magnetic field of at least one of the first, second and third magnet assemblies.

21. A lithographic projection apparatus according to claim 9 or 12, wherein the second magnet assembly has its magnetic polarization substantially oriented parallel or anti-parallel to the second direction, and wherein the support further comprises an electrically conductive element connectable to a power supply, the electrically conductive element being attached to the first part so as to produce a force parallel to the first direction between the first and second parts by interaction of an electrical current carried by the electrically conductive element and a magnetic field of the second magnet assembly.

22. A lithographic projection apparatus, comprising:
a radiation system constructed and arranged to provide a beam of radiation;
a support structure constructed and arranged to provide patterning device, the patterning device constructed and arranged to pattern the beam according to a desired pattern;
a substrate table to hold a substrate;
a projection system constructed and arranged to project the patterned beam onto a target portion of the substrate; and
a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame and wherein the support comprises first and second magnet assemblies that are configured to magnetically cooperate with one another to provide support and the first magnet assembly is attached to the first part and has a magnetic polarization that is oriented substantially parallel or anti-parallel to the first direction, the second magnet assembly is attached to the second part and comprises at least one magnet having its magnetic polarization oriented along a second direction perpendicular to the first direction so as to produce a bias force substantially along the first direction by magnetic interaction between the first and second magnet assemblies, and an electrically conductive element connectable to a power supply, the electrically conductive element being attached to the first part so as to produce a force parallel to the first direction between the first and second parts by interaction of an electrical current carried by the electrically conductive element and a magnetic field of the second magnet assembly.

23. A lithographic projection apparatus according to claim 22, wherein the second magnet assembly and the electrically conductive element have a substantially rotationally symmetric configuration around an axis along the first direction.

24. A lithographic projection apparatus according to claim 22 or 23, wherein the first magnet assembly comprises at least one magnet oriented such that the magnetic polarization of the first magnet assembly is substantially parallel or anti-parallel to the first direction, wherein the magnetic support comprises a third magnet assembly that is configured to magnetically cooperate with the first and second magnet assemblies to provide support, the third magnet assembly being attached to the first part and comprising at least one magnet oriented such that its magnetic polarization is substantially anti-parallel to the magnetic polarization of the first magnet assembly, and wherein the first and third magnet assemblies are substantially spaced apart such that the first and third magnet assemblies define a space between them, in which space the second magnet assembly is at least partly located.

25. A lithographic projection apparatus according to claim 22, wherein at least one of the first and third magnet assemblies has a substantially rotationally symmetric configuration around an axis along the first direction.

26. A lithographic projection apparatus according to claim 22, wherein the second magnet assembly comprises two magnets spaced apart in the second direction to define a further space there between and oriented such that their magnetic polarizations are substantially parallel, and wherein the electrically conductive element is at least partly located in the further space.

27. A lithographic projection apparatus according to claim 22, wherein a dimension in the first direction of the electrically conductive element is significantly larger or significantly smaller than that of a magnet of the second magnet assembly.

28. A lithographic projection apparatus according to claim 10, 16 or 22, wherein one of the first and second parts is supported by the other one of the first and second parts by the support, and wherein the supported one part is one of the support structure, the substrate table, and an isolated reference frame.

29. A lithographic projection apparatus according to claim 22, wherein the first part of the apparatus supports the second part of the apparatus by the support, and the electrically conductive element is attached to the first part, and wherein the supported second part is one of the support structure, the substrate table, and an isolated reference frame.

30. A device manufacturing method, comprising:
providing a substrate that is at least partially covered by a layer of radiation-sensitive material;
providing a beam of radiation using a radiation system;
using a patterning device to endow the beam with a pattern in its cross-section;
projecting the patterned beam of radiation onto a target portion of the layer of radiation-sensitive material; and
providing a support that provides a magnetic force in a first direction between a first part and a second part of the apparatus, the first part being one of a base part and a long stroke module and the second part being one of a short stroke module, the substrate table, a patterning device, an isolated reference frame, and a metrology frame, the support comprising first, second and third magnet assemblies that are configured to magnetically cooperate with one another to provide support, and the first and third magnet assemblies are attached to the first part and each comprises at least one magnet oriented such that its magnetic polarization is substantially parallel or anti-parallel to the first direction; the second magnet assembly is attached to the second part and comprises at least one magnet, and the first and third magnet assemblies are substantially spaced apart in a second direction that is substantially perpendicular to the first direction such that the first and third magnet assemblies define a space between them in which the second magnet assembly is at least partly located; and the at least one magnet of the second magnet assembly has its magnetic polarization oriented so as to produce a bias force substantially along the first support direction by magnetic interaction between the first, second and third magnet assemblies.

31. A device manufactured according to the method of claim 30.

32. A lithographic projection apparatus according to claim 16, wherein the at least one magnet has its magnetic polarization oriented along a second direction substantially perpendicular to the first direction.

33. A lithographic projection apparatus according to claim 32, wherein the support further comprises an electrically conductive element connectable to a power supply, said electrically conductive element being attached to said first part so as to produce a force parallel to said first direction between said first and second parts by interaction of an electrical current carried by said electrically conductive element and a magnetic field of said second magnet assembly.

34. A lithographic projection apparatus according to claim 32 or 33, wherein at least one of the first and second magnet assemblies has a substantially rotationally symmetric configuration around an axis along the first direction.

35. A lithographic projection apparatus, comprising:
a radiation system constructed and arranged to provide a beam of radiation;
a support structure constructed and arranged to support a patterning device, the patterning device constructed and arranged to pattern the beam according to a desired pattern;
a substrate table to hold a substrate;
a projection system constructed and arranged to project the patterned beam onto a target portion of the substrate; and
a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame, wherein the support comprises first, second and third magnets that are configured to magnetically cooperate with one another to provide support and the first and third magnets are attached to the first part and have a magnetic polarization that is substantially parallel or anti-parallel to the first direction, the second magnet is attached to the second part, and wherein the first and third magnets are substantially spaced apart in a second direction that is substantially perpendicular to the first direction such that the first and third magnets define a space between them in which the second magnet is at least partly located, and the second magnet has its magnetic polarization oriented so as to produce a bias force substantially along the first direction by magnetic interaction between the first, second and third magnets.

36. A lithographic projection apparatus, comprising:
a radiation system constructed and arranged to provide a beam of radiation;
a support structure constructed and arranged to support a patterning device, the patterning device constructed and arranged to pattern the beam according to a desired pattern;
a substrate table to hold a substrate;
a projection system constructed and arranged to project the patterned beam onto a target portion of the substrate; and
a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame and wherein the support comprises first, second and third magnets that are configured to magnetically cooperate with one another to provide support, and the first and third magnets are attached to the first part and have a magnetic polarization that is substantially parallel or anti-parallel to the first direction, at least one of the first and third magnets having a substantially rotationally symmetric configuration around an axis along the first direction, the second magnet is attached to the second part, and wherein the first and third magnets are substantially spaced apart such that the first and third magnets define a first space between them in which the second magnet is at least partly located; and the second magnet has its magnetic polarization oriented so as to produce a bias force substantially along the first direction by magnetic interaction between the first, second and third magnets.

37. A lithographic projection apparatus, comprising:
a radiation system constructed and arranged to provide a beam of radiation;
a support structure constructed and arranged to support a patterning device, the patterning device constructed and arranged to pattern the beam according to a desired pattern;
a substrate table to hold a substrate;
a projection system constructed and arranged to project the patterned beam onto a target portion of the substrate; and
a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame and wherein the support comprises a first bottom magnet, a first top magnet and a second magnet that are configured to magnetically cooperate with one another to provide support and the second magnet is attached to the second part and has its magnetic polarization oriented substantially perpendicularly to that of the first bottom magnet and the first top magnet so as to produce a bias force substantially along the first direction by magnetic interaction between the first bottom magnet, the first top magnet and the second magnet, the first bottom magnet and the first top magnet are attached to the first part, a relative position of the first bottom magnet and the first top magnet being adjustable so as to adjust the bias force.

38. A lithographic projection apparatus, comprising:

a radiation system constructed and arranged to provide a beam of radiation;

a support structure constructed and arranged to provide patterning device, the patterning device constructed and arranged to pattern the beam according to a desired pattern;

a substrate table to hold a substrate;

a projection system constructed and arranged to project the patterned beam onto a target portion of the substrate; and a support that provides a magnetic force in a first direction between a first part and a second part of the apparatus, wherein the first part is one of a base part and a long stroke module and the second part is one of a short stroke module, the substrate table, a patterning device, an isolated reference frame, and a metrology frame and wherein the support comprises first and second magnets that are configured to magnetically cooperate with one another to provide support and the first magnet is attached to the first part and has a magnetic polarization that is oriented substantially parallel or anti-parallel to the first direction, the second magnet assembly is attached to the second part and has its magnetic polarization oriented along a second direction perpendicular to the first direction so as to produce a bias force substantially along the first direction by magnetic interaction between the first and second magnets, and an electrically conductive element connectable to a power supply, the electrically conductive element being attached to the first part so as to produce a force parallel to the first direction between the first and second parts by interaction of an electrical current carried by the electrically conductive element and a magnetic field of the second magnet.

39. A device manufacturing method, comprising:

providing a substrate that is at least partially covered by a layer of radiation-sensitive material;

providing a beam of radiation using a radiation system;

using a patterning device to endow the beam with a pattern in its cross-section;

projecting the patterned beam of radiation onto a target portion of the layer of radiation-sensitive material; and providing a support that provides a magnetic force in a first direction between a first part and a second part of the apparatus, the first part being one of a base part and a long stroke module and the second part being one of a short stroke module, the substrate table, a patterning device, an isolated reference frame, and a metrology frame, the support comprising first, second and third magnets that are configured to magnetically cooperate with one another to provide support, and the first and third magnets are attached to the first part and have a magnetic polarization that is substantially parallel or anti-parallel to the first direction; the second magnet is attached to the second part, and the first and third magnets are substantially spaced apart in a second direction that is substantially perpendicular to the first direction such that the first and third magnets define a space between them in which the second magnet is at least partly located; and the second magnet has its magnetic polarization oriented so as to produce a bias force substantially along the first support direction by magnetic interaction between the first, second and third magnets.

* * * * *